(12) United States Patent
Liu et al.

(10) Patent No.: US 10,928,337 B2
(45) Date of Patent: Feb. 23, 2021

(54) HIGH-TEMPERATURE AND HIGH-PRESSURE NUCLEAR MAGNETIC RESONANCE CORE HOLDER

(71) Applicant: INSTITUTE OF GEOLOGY AND GEOPHYSICS CHINESE ACADEMY OF SCIENCES (IGGCAS), Beijing (CN)

(72) Inventors: Naigui Liu, Beijing (CN); Xiaorong Luo, Beijing (CN); Likuan Zhang, Beijing (CN); Yuhong Lei, Beijing (CN); Ming Cheng, Beijing (CN); Jianzhao Yan, Beijing (CN)

(73) Assignee: INSTITUTE OF GEOLOGY AND GEOPHYSICS CHINESE ACADEMY OF SCIENCES (IGGCAS), Beijing (CN)

( * ) Notice: Subject to any disclaimer, the term of this patent is extended or adjusted under 35 U.S.C. 154(b) by 0 days.

(21) Appl. No.: 16/854,912

(22) Filed: Apr. 22, 2020

(65) Prior Publication Data
US 2020/0378911 A1 Dec. 3, 2020

(30) Foreign Application Priority Data
May 29, 2019 (CN) .......................... 201910457379.1

(51) Int. Cl.
*G01N 24/08* (2006.01)
*G01R 33/30* (2006.01)

(52) U.S. Cl.
CPC ......... *G01N 24/081* (2013.01); *G01R 33/305* (2013.01)

(58) Field of Classification Search
CPC .... G01N 24/081; G01R 33/305; G01R 33/31; G01R 33/307
See application file for complete search history.

(56) References Cited

U.S. PATENT DOCUMENTS

2011/0050223 A1 3/2011 Balcom et al.
2013/0335081 A1* 12/2013 Fordham .............. G01N 24/081
324/309

FOREIGN PATENT DOCUMENTS

CN 101907586 A * 12/2010
CN 101907586 A 12/2010
(Continued)

OTHER PUBLICATIONS

English translation of CN 101907586 provided by Espacenet. (Year: 2020).*

(Continued)

*Primary Examiner* — Rishi R Patel
(74) *Attorney, Agent, or Firm* — Westbridge IP LLC

(57) ABSTRACT

The invention relates to a high-temperature and high-pressure nuclear magnetic resonance core holder. An inner cylinder body of the core holder is provided in an outer cylinder body, a nuclear magnetic resonance probe coil is provided between the outer cylinder body and the inner cylinder body, two plugging sleeves are respectively provided between both ends of the inner cylinder body and between both ends of the outer cylinder body, a sealing groove is provided at the inner side of each plugging sleeve, a sealing joint component is provided in each sealing groove of each plugging sleeve, and two ends of the nuclear magnetic resonance probe coil are respectively connected with the sealing joint component, so that the nuclear magnetic resonance probe coil can be led out. The holder disclosed by the invention is compatible with nuclear magnetic resonance, integrates injection displacement experiments and nuclear magnetic resonance measurement, and adopts a sealing solution to ensure the sealing performance of the joint of the outer cylinder body and the inner cylinder body, so as to adapt to nuclear magnetic resonance on-line (Continued)

measurement and analysis experiments under the condition of simulative deep basin high-temperature and high-pressure.

7 Claims, 3 Drawing Sheets

(56) References Cited

FOREIGN PATENT DOCUMENTS

| | | |
|---|---|---|
| CN | 102288629 A | 12/2011 |
| CN | 102507626 A | 6/2012 |
| CN | 105891248 A | 8/2016 |
| WO | 2013171544 A1 | 11/2013 |
| WO | 2018140319 A1 | 8/2018 |

OTHER PUBLICATIONS

First Office Action of the prior Chinese patent application issued by CNIPA dated Dec. 3, 2019.

\* cited by examiner

US 10,928,337 B2

HIGH-TEMPERATURE AND HIGH-PRESSURE NUCLEAR MAGNETIC RESONANCE CORE HOLDER

RELATED APPLICATIONS

This application is a Non-provisional Application under 35 USC 111(a), which claims Chinese Patent Application Serial No. CN201910457379. 1, filed May 29, 2019, the disclosure of all of which is hereby incorporated by reference in their entirety.

TECHNICAL FIELD

The invention relates to the technical field of exploration and development, and particularly, to a high-temperature and high-pressure nuclear magnetic resonance core holder.

BACKGROUND ART

In the research of petroleum exploration and development, geothermal geology, environmental protection, hydrogeology and so on, it is necessary to take out the stratum core from the underground, carry out physical property analysis experiments of the core, measure the physical property parameters of the core, such as porosity, permeability and so on, and to perform displacement experiments related to exploration and development. Nuclear magnetic resonance (NMR) technology, as an analytical method, has been rapidly developed and widely used because it can nondestructively test the properties of hydrogen-containing fluids in samples and has the advantages of rapidity, accuracy, high resolution and so on. Therefore, it is necessary to study a core holder which can meet the requirements of NMR experiments. The core holder is a kind of tool which seals and holds the core and assists in completing physical property tests of the core and related experiments.

In the prior art, a conventional core holder employs an inner cylinder body and an outer cylinder body, a core is placed in the inner cylinder body, plugging sleeves are respectively provided between both ends of the inner cylinder body and between both ends of the outer cylinder body to seal and form a confining pressure cavity, fluid flows into the inner cylinder body through a through hole in the center of the plugging sleeves to form displacement pressure, a high-temperature and high-pressure fluid flows into the confining pressure cavity to form formation pressure and temperature, and the displacement experiment is performed by simulating the formation pressure and temperature using the above method.

When implementing the present invention, the applicant found that the prior art has at least the following disadvantages:

in the prior art, the working pressure of the core holder compatible with nuclear magnetic resonance is mostly below 30 MPa, the working temperature is generally below 100° C.; and for the simulation experiment under the deep basin high-temperature and high-pressure condition, the working pressure is mostly around 100 MPa, the working temperature is around 150° C. When the simulation experiment under the deep basin high-temperature and high-pressure condition is carried out, the high-temperature and high-pressure fluid is provided inside the confining pressure cavity, and the standard atmospheric pressure exists outside the outer cylinder body, such a difference of the internal and external temperature and pressure conditions requires a high sealing performance of the joint of the outer cylinder and the inner cylinder, which is unable to be rendered by the core holder in the prior art.

SUMMARY OF THE INVENTION

It's an object of the invention to solve the above problems in the prior art by providing a high-temperature and high-pressure nuclear magnetic resonance core holder to adapt to simulation experiments under the conditions of deep basin high temperature and high pressure.

The invention achieves the above object by implementing the following technical solution:

a high-temperature and high-pressure nuclear magnetic resonance core holder, comprising:

an outer cylinder body;

an inner cylinder body provided in the outer cylinder body;

a nuclear magnetic resonance probe coil provided between the outer cylinder body and the inner cylinder body;

two plugging sleeves respectively provided between both ends of the inner cylinder body and between both ends of the outer cylinder body, with a sealing groove provided at the inner side of each plugging sleeve;

a sealing joint component provided in the sealing groove of each of the plugging sleeves, the sealing joint component comprising:

an enameled wire, one end of the enameled wire being positioned between the outer cylinder body and the inner cylinder body, and the other end of the enameled wire sequentially passing through the sealing groove and the plugging sleeve;

an electrode positioned in the sealing groove and provided on the enameled wire;

an electrode insulating sleeve fixedly provided on the electrode, and provided in the sealing groove in a fitting manner;

an electrode pressing cap in threaded connection with an opening of the sealing groove, the enameled wire passing through the electrode pressing cap flexibly, and the electrode pressing cap being provided against the electrode;

a sealing ring provided between the electrode insulating sleeve and the electrode pressing cap, and the sealing ring being sleeved on the electrode;

wherein two ends of the nuclear magnetic resonance probe coil are respectively connected with the enameled wires of the sealing joint components in the sealing grooves of the two plugging sleeves.

Further, the sealing joint component further comprises an electrode supporting sleeve, the electrode supporting sleeve is provided in the sealing groove in a fitting manner, the electrode supporting sleeve is provided between a bottom of the sealing groove and the electrode insulating sleeve, and the enameled wire passes through the electrode supporting sleeve flexibly.

Further, the outer cylinder body is configured to be cut-through from one end to the other, the two ends of the outer cylinder body are respectively in threaded connection with the fixing pressing cap, a through hole is formed in a center of the fixing pressing cap, the plugging sleeve passes through the through hole flexibly, a retainer block is provided in the plugging sleeve, the retainer block is connected to an end part of the outer cylinder body, and a sealing component is provided between the retainer block and the end part of the outer cylinder body.

Further, the outer cylinder body is made of a titanium alloy material;

a confining pressure inlet and a confining pressure outlet are provided on a circumferential surface of the outer cylinder body, connecting joints are welded at the confining pressure inlet and the confining pressure outlet, and the connecting joints are also made of titanium alloy materials.

Further, the connecting joint is provided with a connecting hole;

the core holder further comprises a high-pressure joint, the high-pressure joint is fixedly provided in the connecting hole of the connecting joint at the confining pressure inlet, the high-pressure joint comprises a stick part and a high-pressure pressing cap, the high-pressure pressing cap is fixedly connected to a tail of the stick part, a head of the stick part is provided with a connecting block, the connecting block is frustum-shaped, and a bottom surface and a top surface of the connecting block are arranged in a direction sequentially away from the high-pressure pressing cap; the high-pressure pressing cap, the stick part and the connecting block are provided with through injection holes.

Further, the core holder further comprises a coil support, the coil support is fixedly provided on an outer side of the inner cylinder body, and the nuclear magnetic resonance probe coil is wound on an outer side of a circumferential surface of the coil support.

Even further, the coil support comprises a cylinder body and two connecting plates, wherein:

the cylinder body is coaxially provided on an outer side of the inner cylinder body, a spiral groove is formed in an outer side of a circumferential surface of the cylinder body, and coil fixing holes are formed in both axial sides of the circumferential surface of the cylinder body;

the two connecting plates are fixedly provided on radial outer sides of an end part of the cylinder body, each of the connecting plates is fixedly connected to an inner side of the plugging sleeve at the same end, a coil through hole is formed in each of the connecting plates, the nuclear magnetic resonance probe coil is wound in the spiral groove, two ends of the nuclear magnetic resonance probe coil are fixedly connected in two coil fixing holes, and two ends of the nuclear magnetic resonance probe coil respectively pass through the coil through holes in the two connecting plates and are connected with the enameled wires of the sealing joint components in the sealing grooves of the two plugging sleeves.

Further, confining pressure balance holes are provided at two axial ends of a circumferential surface of the cylinder body.

Further, the core holder further comprises two end plugs corresponding to the plugging sleeves one by one, and the two end plugs pass through the corresponding plugging sleeves;

two ends of the inner cylinder body are hermetically sleeved inside the two plugging sleeves, replaceable filling blocks are provided on inner sides of the two end plugs, and a sample to be tested is clamped between the two filling blocks.

Further, the inner side of the end plug and the side, facing the sample to be tested, of the filling block are both provided with grooves.

The invention has the following advantages:

the invention provides a high-temperature and high-pressure nuclear magnetic resonance core holder, comprising an outer cylinder body and an inner cylinder body provided in the outer cylinder body, and two plugging sleeves are respectively provided between both ends of the inner cylinder body and between both ends of the outer cylinder body to seal and form a confining pressure cavity, so that during experiments, a core can be placed in the inner cylinder body, fluid flows into the inner cylinder body through a through hole in the center of the plugging sleeve to generate displacement pressure, and the high-temperature and high-pressure fluid flows into the confining pressure cavity to form formation pressure and temperature. The nuclear magnetic resonance probe coil is provided between the outer cylinder body and the inner cylinder body, therefore, in-situ on-line nuclear magnetic resonance information measurement can be implemented by means of the nuclear magnetic resonance probe coil, the formation pressure and temperature can be simulated, and displacement experiments can be performed for the core.

A sealing groove is formed in the inner side of each plugging sleeve, a sealing joint component is provided in each sealing groove of each plugging sleeve, the sealing joint component comprises an enameled wire, one end of the enameled wire is positioned between the outer cylinder body and the inner cylinder body, the other end of the enameled wire sequentially passes through the sealing groove and the plugging sleeve, and two ends of the nuclear magnetic resonance probe coil are respectively connected with the enameled wires of the sealing joint components in the sealing grooves of the two plugging sleeves, so that the nuclear magnetic resonance probe coil can be led out.

The sealing joint component further comprises an electrode, an electrode insulating sleeve, an electrode pressing cap and a sealing ring which are all positioned in the sealing groove, wherein the electrode is provided on the enameled wire, the electrode insulating sleeve is fixedly provided on the electrode, the electrode insulating sleeve is provided in the sealing groove in a fitting manner, the electrode pressing cap is in threaded connection with an opening of the sealing groove, the enameled wire passes through the electrode pressing cap flexibly, the electrode pressing cap is provided against the electrode, the sealing ring is provided between the electrode insulating sleeve and the electrode pressing cap, and the sealing ring is provided on the electrode, as such, when the confining pressure is filled between the outer cylinder body and the inner cylinder body, the confining pressure can exert pressure on the electrode pressing cap, the higher the pressure is, the more tightly the electrode pressing cap presses against the sealing ring, as a result, the sealing performance of the joint where the enameled wire of the sealing joint component passes through the plugging sleeve can be guaranteed, and in turn the sealing performance of the joint of the outer cylinder body and the inner cylinder body can be guaranteed, so as to adapt to the simulation experiment under the deep basin high-temperature and high-pressure condition.

BRIEF DESCRIPTION OF THE DRAWINGS

In order to more clearly illustrate the technical solutions of the embodiments of the present invention, the drawings used in the description of the embodiments are briefly described below, and it is obvious that the drawings in the description below illustrate only some of the embodiments of the present invention, and that other drawings can be obtained from these drawings without involving any inventive effort by a person skilled in the art.

DETAILED DESCRIPTION OF THE INVENTION

In the following, the technical solutions in the embodiments of the present invention will be clearly and completely described with reference to the drawings in the embodiments of the present invention. Obviously, the described embodiments are only some, but not all, of the embodiments of the present invention. All other embodiments obtained by a person of ordinary skill in the art from the embodiments of the present invention without inventive efforts shall fall within the protection scope of the present invention.

Figure 1:
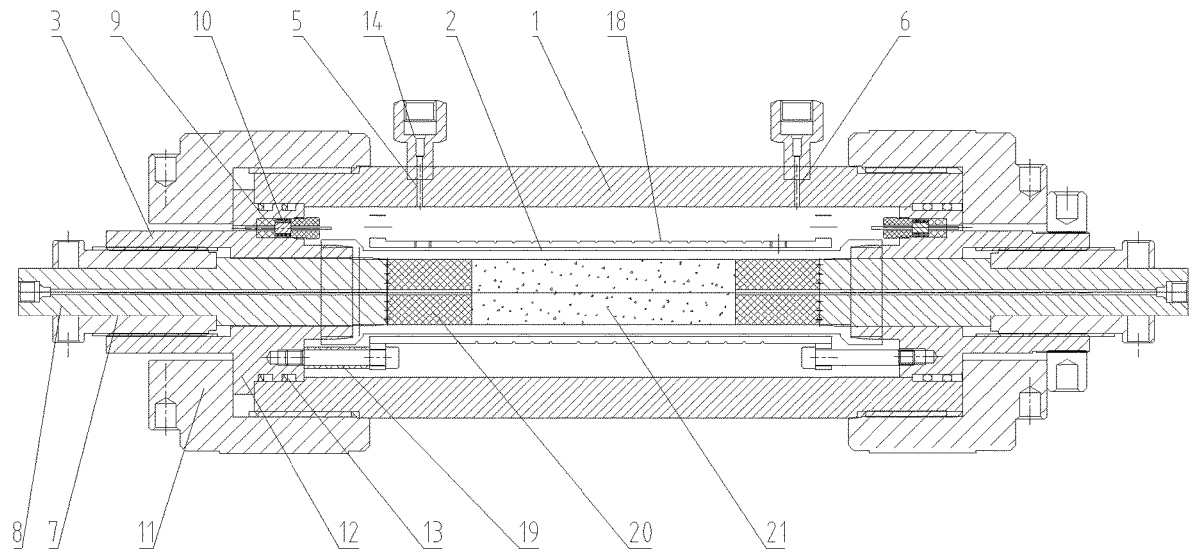
FIG. 1 is a structural schematic diagram of a high-temperature and high-pressure nuclear magnetic resonance core holder according to an embodiment of the present invention.
Figure 7:
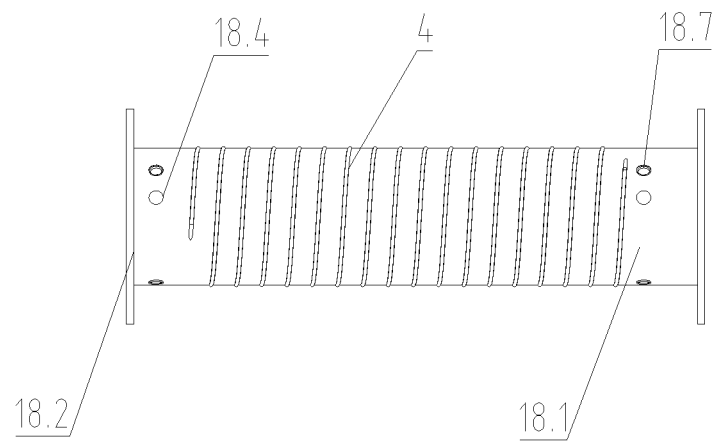
FIG. 7 is a schematic view of the assembly of the nuclear magnetic resonance probe coil on the coil support.

FIG. 1 is a structural schematic diagram of a high-temperature and high-pressure nuclear magnetic resonance core holder according to an embodiment of the invention, and with reference to FIG. 1 and FIG. 7, the core holder mainly includes an outer cylinder body 1, an inner cylinder body 2, a plugging sleeve 3 and a nuclear magnetic resonance probe coil 4. Here, the nuclear magnetic resonance probe coil 4 is shown in FIG. 7.

In combination with FIG. 1, the inner cylinder body 2 of the core holder according to the embodiment of the invention is provided in the outer cylinder body 1, preferably coaxially provided, the inner cylinder body 2 and the outer cylinder body 1 enclose a confining pressure cavity, and the circumferential surface of the outer cylinder body 1 is provided with a confining pressure inlet 5 and a confining pressure outlet 6, confining pressure can be injected into a region between the inner cylinder body 2 and the outer cylinder body 1 through the confining pressure inlet 5, two plugging sleeves 3 are respectively provided between both ends of the inner cylinder body 2 and between both ends of the outer cylinder body 1, and a through hole 7 are provided in the center of each of the two plugging sleeves 3, and an end plug 8 is provided in the through hole 7, so that during experiments, the core can be placed in the inner cylinder body 2, and fluid flows into the inner cylinder body 2 through the through hole in the center of the plugging sleeve 3 to generate displacement pressure.

In the prior art, the outer cylinder body of the core holder compatible with nuclear magnetic resonance is mostly made of materials such as a glass fiber composite and the like, due to the limitation of material performance, the working pressure of the holder is mostly below 30 MPa, and the working temperature is generally below 100° C. However, during experiments, high-temperature and high-pressure fluid is provided in the confining pressure cavity inside the outer cylinder body, and a standard atmospheric pressure state exists outside the outer cylinder body, such a difference of the internal and external temperature and pressure conditions imposes a higher requirement for the temperature and pressure of the outer cylinder body. In view of this, in the embodiment of the invention, a titanium alloy material is selected to be the material of the outer structure (including the outer cylinder body and some accessories) of the core holder to meet the requirements of temperature and pressure resistance.

In addition, in the prior art, the nuclear magnetic resonance probe coil is mostly provided outside the outer cylinder body of the core holder, as a result, the requirement of deep-layer high-temperature and high-pressure simulation cannot be met due to failure to get rid of the limitation of material performance. In order to implement the online experiment of nuclear magnetic resonance, in the embodiment of the present invention, the nuclear magnetic resonance probe coil is provided between the outer cylinder body 1 and the inner cylinder body 2, so that the nuclear magnetic resonance experiment can be performed under the protection of the outer cylinder with temperature and pressure resistance.

Figure 2:
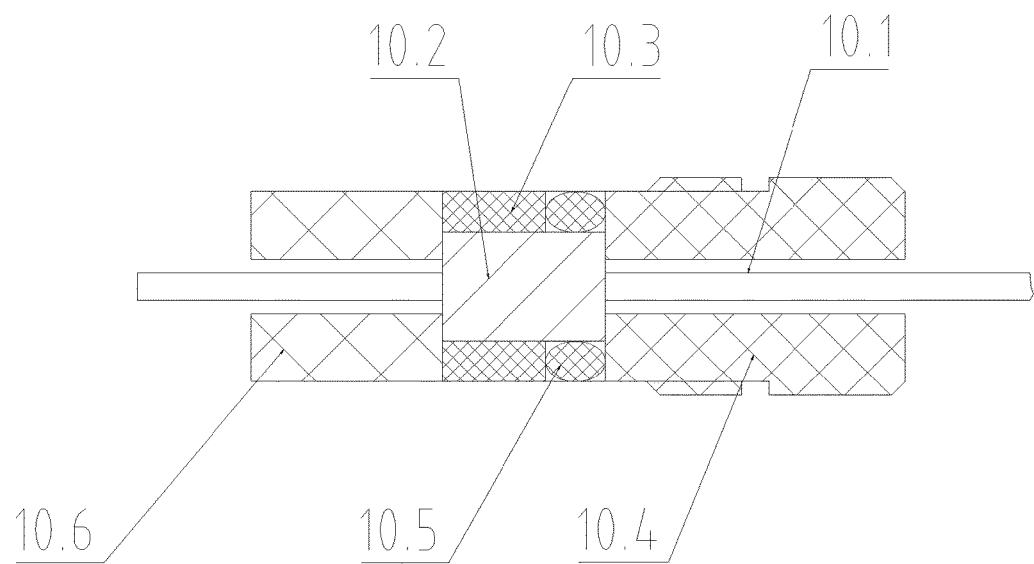
FIG. 2 is a structural schematic diagram of the sealing joint component of FIG. 1.

With reference to FIG. 1, a sealing groove 9 is provided at the inner side of the plugging sleeve 3 of the embodiment of the invention; FIG. 2 is a structural schematic diagram of the sealing joint component of FIG. 1. With reference to FIGS. 1 and 2 combined, a sealing joint component 10 is provided in the sealing groove 9 of each plugging sleeve 3 according to the embodiment of the present invention, the sealing joint component 10 including:

an enameled wire 10.1, one end of the enameled wire 10.1 being positioned between the outer cylinder body 1 and the inner cylinder body 2, and the other end of the enameled wire 10.1 sequentially passing through the sealing groove 9 and the plugging sleeve 3;

an electrode 10.2 positioned in the sealing groove 9 and provided on the enameled wire 10.1;

an electrode insulating sleeve 10.3 fixedly provided on the electrode 10.2, and provided in the sealing groove 9 in a fitting manner;

an electrode pressing cap 10.4 in threaded connection with an opening of the sealing groove 9, the enameled wire 10.1 passing through the electrode pressing cap 10.4 flexibly, and the electrode pressing cap 10.4 being provided against the electrode 10.2;

a sealing ring 10.5 provided between the electrode insulating sleeve 10.3 and the electrode pressing cap 10.4, and the sealing ring 10.5 being sleeved on the electrode 10.2;

wherein two ends of the nuclear magnetic resonance probe coil are respectively connected with the enameled wires 10.1 of the sealing joint components 10 in the sealing grooves 9 of the two plugging sleeves 3, so that the nuclear magnetic resonance probe coil can be led out.

In the actual test, when the confining pressure fluid is filled between the outer cylinder body and the inner cylinder body, the confining pressure can exert pressure on the electrode pressing cap, the higher the pressure is, the more tightly the electrode pressing cap presses against the sealing ring, as a result, the sealing performance of the joint where the enameled wire of the sealing joint component passes through the plugging sleeve can be guaranteed, and in turn the sealing performance of the joint of the outer cylinder body and the inner cylinder body can be guaranteed, so as to adapt to the simulation experiment under the deep basin high-temperature and high-pressure condition.

It should be noted that the sealing ring 10.5 of an embodiment of the present invention is preferably an O-shaped ring.

Further, with reference to FIGS. 1 and 2, the sealing joint component 10 of the embodiment of the present invention further includes an electrode support sleeve 10.6 provided in the sealing groove 9 in a fitting manner, the electrode support sleeve 10.6 is provided between the bottom of the sealing groove 9 and the electrode insulating sleeve 10.3, and the enameled wire 10.1 passes through the electrode support sleeve 10.6 flexibly, so that sealing can be rendered and electric leakage can be avoided.

It should be noted that in the embodiment of the invention, either the fit between the electrode insulating sleeve 10.3 and the sealing groove 9, or the fit between the electrode supporting sleeve 10.6 and the sealing groove 9 is preferably an interference fit, which can further improve the sealing performance.

Further, with reference to FIG. 1, the outer cylinder body 1 of the embodiment of the invention is configured to be cut-through from one end to the other, the two ends of the outer cylinder body 1 are respectively in threaded connection with the fixing pressing cap 11, a through hole is formed in a center of the fixing pressing cap 11, the plugging sleeve 3 passes through the through hole flexibly, a retainer block 12 is provided in the plugging sleeve, the retainer block 12 is connected to an end part of the outer cylinder body 1, and a sealing component 13 is provided between the retainer block 12 and the end part of the outer cylinder body 1, so as to render sealing between the plugging sleeve 3 and the outer cylinder body 1.

It should be noted that at least two sealing components 13 may be provided, and each sealing component 13 may be consisted of an O-shaped ring and a retainer ring.

In order to realize injection of confining pressure between the outer cylinder body 1 and the inner cylinder body 2, a connecting joint 14 is further provided at the confining pressure inlet 5 and the confining pressure outlet 6 in the embodiment of the invention, and also the connecting joint 14 is made of a titanium alloy material; and in order to avoid local magnetism possibly generated by oxidation of the titanium alloy material, the connecting joint 14 is respectively welded in the confining pressure inlet 5 and the confining pressure outlet 6 by an argon arc welding technology in the embodiment of the invention, as such, during high-temperature fusion welding, the joint and its surroundings are in an inert gas environment, and the local magnetism generated by oxidation of the titanium alloy material can be avoided.

In the embodiment of the invention, the high-pressure joint can be connected with the connecting joint 14 at the confining pressure inlet 5, so that fluid can be injected into the confining pressure cavity, and air is discharged from the confining pressure outlet 6.

Figure 3:
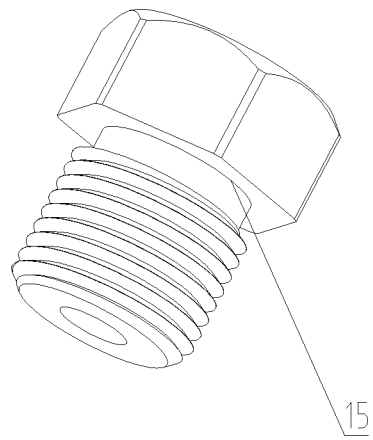
FIG. 3 is a structural schematic diagram of a stick part of a high-pressure joint according to an embodiment of the present invention.
Figure 4:
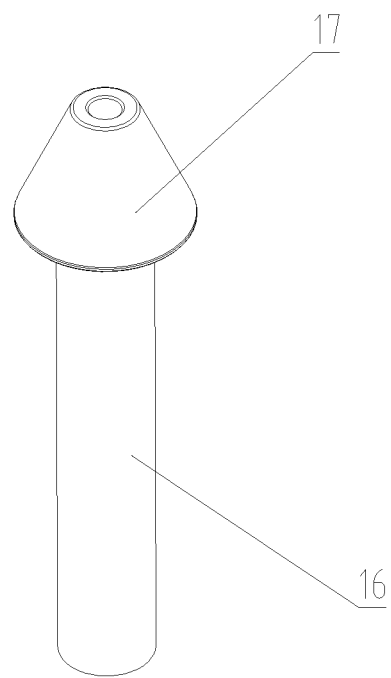
FIG. 4 is a structural schematic diagram of a high-pressure pressing cap of the high-pressure joint according to an embodiment of the present invention.

The high-pressure joint in the embodiment of the invention includes a stick part and a high-pressure pressing cap, FIG. 3 is a structural schematic diagram of the stick part of the high-pressure joint according to an embodiment of the present invention, and FIG. 4 is a structural schematic diagram of the high-pressure pressing cap of the high-pressure joint according to an embodiment of the present invention, with reference to FIGS. 1, 3 and 4 combined, the high-pressure joint of the embodiment of the invention is provided fixedly in a connecting hole of the connecting joint 14 at the confining pressure inlet 15, the high-pressure pressing cap 15 of the high-pressure joint is fixedly connected to a tail of the stick part 16, a head of the stick part 16 is provided with a connecting block 17 which is frustum-shaped, a bottom surface and a top surface of the connecting block 17 are arranged in a direction sequentially away from the high-pressure pressing cap 15, and the high-pressure pressing cap 15, the stick part 16 and the connecting block 17 are provided with through injection holes.

In use, the stick part 16 of the high-pressure joint is inserted into the connecting hole of the connecting joint 14 at the confining pressure inlet 5, and a diversion pipeline is welded in the injection hole, so that fluid can be injected into the confining pressure cavity through the diversion pipeline.

According to the embodiment of the invention, the connecting block 17 at the head of the stick part 16 is designed to be a frustum shape, which renders better sealing performance and improved adaptation to simulation experiments under higher temperature and pressure conditions compared with the spherical design in the prior art.

With reference to FIG. 1, the core holder of the embodiment of the invention further includes a coil support 18 fixedly provided on the outer side of the inner cylinder body 2, and the nuclear magnetic resonance probe coil is wound on the outer side of the circumferential surface of the coil support.

Figure 5:
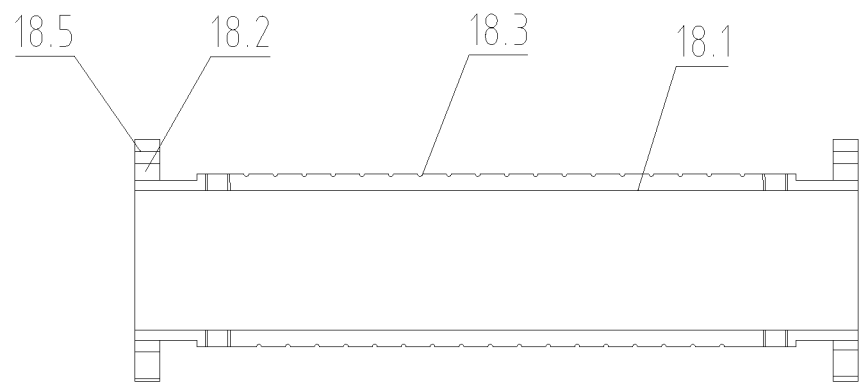
FIG. 5 is a structural schematic diagram of a coil support of FIG. 1.
Figure 6:
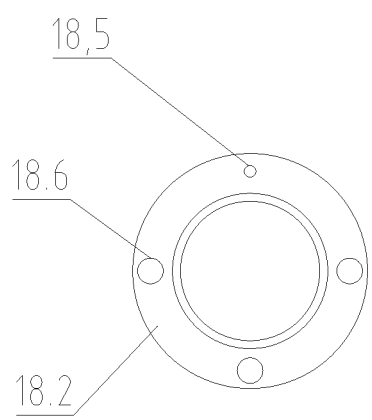
FIG. 6 is a schematic side view of FIG. 5.

Further, FIG. 5 is a structural schematic diagram of a coil support of FIG. 1, FIG. 6 is a schematic side view of FIG. 5, and FIG. 7 is a schematic view of the assembly of the nuclear magnetic resonance probe coil on the coil support. With reference to FIGS. 1, 5, 6, and 7 combined, the coil support 18 of an embodiment of the invention includes a cylinder body 18.1 and two connecting plates 18.2, wherein: the cylinder body 18.1 is coaxially provided on an outer side of the inner cylinder body 2, a spiral groove 18.3 is formed in an outer side of a circumferential surface of the cylinder body 18.1, and coil fixing holes 18.4 are formed in both axial sides of the circumferential surface of the cylinder body 18.1; and the two connecting plates 18.2 are fixedly provided on radial outer sides of an end part of the cylinder body 18.2, each of the connecting plates 18.2 is fixedly connected to an inner side of the plugging sleeve 3 at the same end, a coil through hole 18.5 is formed in each of the connecting plates 18.2.

With reference to FIG. 7, the nuclear magnetic resonance probe coil 4 of an embodiment of the invention is wound in the spiral groove 18.3, two ends of the nuclear magnetic resonance probe coil 4 are fixedly connected in two coil fixing holes 18.4, and two ends of the nuclear magnetic resonance probe coil 4 respectively pass through the coil through holes 18.5 in the two connecting plates 18.2 and are connected with the enameled wires 10.1 of the sealing joint components 10 in the sealing grooves 9 of the two plugging sleeves 3, as such, the magnetic resonance probe coil 4 can be fixed and connected with the outside.

Further, with reference to FIGS. 1 and 6, the connecting plate 18.2 of an embodiment of the invention may be further provided with bolt holes 18.6, and a fixed connection of the connecting plate with the plugging sleeve 3 is rendered by a plurality of bolts 19.

According to the above, the nuclear magnetic resonance probe coil of the core holder of the embodiment of the invention is provided between the outer cylinder body and the inner cylinder body, such a design enables high-temperature and high-pressure resistant metal joints and the like to be positioned outside the nuclear magnetic resonance probe coil, without generating eddy currents on the nuclear magnetic resonance probe coil, thereby really integrating injection displacement experiments with the nuclear magnetic resonance measurement; and in addition, the diameter of the nuclear magnetic resonance probe coil can be reduced from 12 cm to 4 cm, with the signal-to-noise ratio of the nuclear magnetic resonance measurement greatly improved.

Further, with reference to FIG. 7, the coil support 18 of the embodiment of the present invention may be manufactured from PEEK (polyetheretherketone) material, and confining pressure balance holes 18.7 are provided at both axial ends of the circumferential surface of the cylinder body 18.1 for maintaining the pressure balance inside and outside the coil support 18.

With reference to FIG. 1, in the embodiment of the invention, both ends of the inner cylinder body 2 are hermetically sleeved inside the two plugging sleeves, replaceable filling blocks 20 are provided at inner sides of the two end plugs, and a sample to be tested 21 is clamped between the two filling blocks 20, as such, a variable measurement space for the sample is rendered by changing the size of the filling blocks 21, which is advantageous to the tests of samples to be tested 21 having different lengths.

According to the embodiment of the invention, the inner side of the end plug 8 and the side, facing the sample to be tested 21, of the filling block 20 are both provided with grooves, so that the injection area of the contact end with the sample to be tested can be increased, overcoming the limitation caused by single-point injection.

According to the embodiment of the invention, the grooves on the inner side of the end plug 8 and the side, facing the sample to be tested 21, of the filling block 20 can a plurality of concentric rings, a mesh pattern, or other patterns, such as special patterns and the like, which is not limited to the embodiments herein.

The filling block of the embodiment of the invention can be a cylinder made of PEEK material, provided with a diversion hole in the center thereof for fluid to pass through.

According to the embodiment of the invention, the confining pressure cavity is filled with fluorine oil which is refined and processed by taking fluorine chlorocarbon oil as the base oil, and the fluorine oil has excellent chemical stability, good insulating property, no color and no toxicity, being incombustible and free of generating nuclear magnetic resonance signals, and is thus suitable for high-temperature and high-pressure conditions.

The inner cylinder body 2 of the embodiment of the invention can be a fluorine rubber tube which is made of synthetic rubber containing fluorine atoms, and the fluorine rubber tube is high-temperature resistant, pressure resistant, oil resistant and aging resistant, with little nuclear magnetic resonance signal interference generated. The fluid in the confining pressure cavity transmits the temperature and the pressure to the sample to be tested in the fluorine rubber tube, and the temperature and pressure conditions of the sample to be tested in the stratum environment can be simulated.

The above embodiments are preferred ones of the present invention, and are only used to facilitate the description of the present invention, but not to limit the present invention in any form. Equivalent embodiments having partial changes or modifications made by those with ordinary skill in the art without departing from the technical features of the present invention and by using the technical content disclosed herein shall still fall within the scope of the technical features of the present invention.

What is claimed is:

1. A high-temperature and high-pressure nuclear magnetic resonance core holder, characterized by comprising:
    an outer cylinder body;
    an inner cylinder body provided in the outer cylinder body;
    a nuclear magnetic resonance probe coil provided between the outer cylinder body and the inner cylinder body;
    two plugging sleeves respectively provided between both ends of the inner cylinder body and between both ends of the outer cylinder body, with a sealing groove provided at the inner side of each plugging sleeve; and
    a sealing joint component provided in the sealing groove of each of the plugging sleeves, the sealing joint component comprising:
        an enameled wire, one end of the enameled wire being positioned between the outer cylinder body and the inner cylinder body, and the other end of the enameled wire sequentially passing through the sealing groove and the plugging sleeve;
        an electrode positioned in the sealing groove and provided on the enameled wire;
        an electrode insulating sleeve fixedly provided on the electrode, and provided in the sealing groove in a fitting manner;
        an electrode pressing cap in threaded connection with an opening of the sealing groove, the enameled wire passing through the electrode pressing cap flexibly, and the electrode pressing cap being provided against the electrode; and
        a sealing ring provided between the electrode insulating sleeve and the electrode pressing cap, and the sealing ring being sleeved on the electrode;
    wherein two ends of the nuclear magnetic resonance probe coil are respectively connected with enameled wires of sealing joint components in sealing grooves of the two plugging sleeves.

2. The high-temperature and high-pressure nuclear magnetic resonance core holder according to claim 1, characterized in that the sealing joint component further comprises an electrode supporting sleeve, the electrode supporting sleeve is provided in the sealing groove in a fitting manner, the electrode supporting sleeve is provided between a bottom of the sealing groove and the electrode insulating sleeve, and the enameled wire passes through the electrode supporting sleeve flexibly.

3. The high-temperature and high-pressure nuclear magnetic resonance core holder according to claim 1, characterized in that the outer cylinder body is configured to be cut-through from one end to an other end, the two ends of the outer cylinder body are respectively in threaded connection with a fixing pressing cap, a through hole is formed in a center of the fixing pressing cap, the plugging sleeve passes through the through hole flexibly, a retainer block is provided in the plugging sleeve, the retainer block is connected to an end part of the outer cylinder body, and a sealing component is provided between the retainer block and the end part of the outer cylinder body.

4. The high-temperature and high-pressure nuclear magnetic resonance core holder according to claim 1, characterized in that the outer cylinder body is made of a titanium alloy material;
    a confining pressure inlet and a confining pressure outlet are provided on a circumferential surface of the outer cylinder body, connecting joints are welded at the confining pressure inlet and the confining pressure outlet, and the connecting joints are also made of titanium alloy materials.

5. The high-temperature and high-pressure nuclear magnetic resonance core holder according to claim 4, characterized in that the connecting joints are provided with a connecting hole;
    the high-temperature and high-pressure nuclear magnetic resonance core holder further comprises a high-pressure joint, the high-pressure joint is fixedly provided in the connecting hole of the connecting joints at the confining pressure inlet, the high-pressure joint comprises a stick part and a high-pressure pressing cap, the high-pressure pressing cap is fixedly connected to a tail of the stick part, a head of the stick part is provided with a connecting block, the connecting block is frustum-shaped, and a bottom surface and a top surface of the connecting block are arranged in a direction sequentially away from the high-pressure pressing cap; the high-pressure pressing cap, the stick part and the connecting block are provided with through injection holes.

6. The high-temperature and high-pressure nuclear magnetic resonance core holder according to claim 1, characterized by further comprising a coil support fixedly provided on an outer side of the inner cylinder body, and the nuclear magnetic resonance probe coil being wound on an outer side of a circumferential surface of the coil support.

7. The high-temperature and high-pressure nuclear magnetic resonance core holder according to claim 6, characterized in that the coil support comprises a cylinder body and two connecting plates, wherein:

the cylinder body is coaxially provided on an outer side of the inner cylinder body, a spiral groove is formed in an outer side of a circumferential surface of the cylinder body, and coil fixing holes are formed in both axial sides of the circumferential surface of the cylinder body; the two connecting plates are fixedly provided on radial outer sides of an end part of the cylinder body, each of the connecting plates is fixedly connected to an inner side of the plugging sleeve at a same end, a coil through hole is formed in each of the connecting plates, the nuclear magnetic resonance probe coil is wound in the spiral groove, two ends of the nuclear magnetic resonance probe coil are fixedly connected in two coil fixing holes, and two ends of the nuclear magnetic resonance probe coil respectively pass through the coil through holes in the two connecting plates and are connected with the enameled wires of the sealing joint components in the sealing grooves of the two plugging sleeves.

\* \* \* \* \*